(12) United States Patent
Mazzillo et al.

(10) Patent No.: US 12,707,682 B2
(45) Date of Patent: Aug. 11, 2026

(54) SEMICONDUCTOR DEVICE WITH IMPROVED JUNCTION TERMINATION EXTENSION

(71) Applicant: NEXPERIA B.V., Nijmegen (NL)

(72) Inventors: Massimo Cataldo Mazzillo, Hamburg (DE); Georgio El-Zammar, Hamburg (DE); Sönke Habenicht, Hamburg (DE)

(73) Assignee: NEXPERIA B.V., Nijmegen (NL)

( * ) Notice: Subject to any disclaimer, the term of this patent is extended or adjusted under 35 U.S.C. 154(b) by 372 days.

(21) Appl. No.: 18/435,698

(22) Filed: Feb. 7, 2024

(65) Prior Publication Data

US 2024/0266388 A1 Aug. 8, 2024

(30) Foreign Application Priority Data

Feb. 8, 2023 (EP) .................................... 23155664

(51) Int. Cl.
*H10D 62/10* (2025.01)

(52) U.S. Cl.
CPC ................................ *H10D 62/106* (2025.01)

(58) Field of Classification Search
CPC .................................................... H10D 62/106
See application file for complete search history.

(56) References Cited

U.S. PATENT DOCUMENTS

2018/0047652 A1* 2/2018 Papadopoulos ..... H10W 74/137
2018/0114830 A1* 4/2018 Griebl .................. H10D 30/665
2018/0233563 A1* 8/2018 Hiyoshi ............... H10D 30/665

* cited by examiner

*Primary Examiner* — Norman D Richards
*Assistant Examiner* — Sean Ayers Winters
(74) *Attorney, Agent, or Firm* — Ruggiero McAllister & McMahon LLC

(57) ABSTRACT

A semiconductor device is provided including: an epitaxial layer doped with a first type of charge carrier; at least one junction termination extension (JTE), embedded in the epitaxial layer so that an upper surface of the JTE is flush with an upper surface of the epitaxial layer, the JTE is doped with a second type of charge carrier different from the first type and at a higher doping concentration than the concentration of the epitaxial layer; a passivation layer containing a sufficient quantity of the second type of charge carrier disposed on a part of an upper surface of the JTE, so that the passivation layer is arranged to induce a surface charge density greater than 5E11 $cm^{-2}$ of the second type of charge on the part of the upper surface of the JTE, by depleting an interior area of the JTE of free charge carriers of the second type.

18 Claims, 7 Drawing Sheets

SEMICONDUCTOR DEVICE WITH IMPROVED JUNCTION TERMINATION EXTENSION

CROSS-REFERENCE TO RELATED APPLICATIONS

This application claims the benefit under 35 U.S.C. § 119(a) of European Patent application Ser. No. 23/155,664.8 filed Feb. 8, 2023, the contents of which s are incorporated by reference herein in their entirety.

BACKGROUND

1. Field of the Disclosure

The present disclosure generally relates to a semiconductor device and a method of manufacturing a semiconductor device.

2. Description of the Related Art

A JTE (Junction Termination Extension, sometimes also called a Field Limiting Ring, FLR) surrounds an anode metal contact and is electrically connected to it. The JTE serves to spread the intersections of equipotential lines with the surface away from the side of the metal contact to more distant points along the surface up to the termination periphery.

The JTE layer should be designed so that, at the breakdown, it is fully depleted to support a high electrical field. An optimal JTE design requires precise control of the sheet density of dopants in the JTE layer to achieve the desired breakdown characteristics.

In general, given the epitaxial layer doping, the ideal JTE charge (i.e. ideal P type doping or dose) can be calculated (see e.g. Mahajan, Atul, and B. J. Skromme. "Design and optimization of junction termination extension (JTE) for 4H-SiC high-voltage Schottky diodes." *Solid-State Electronics* 49.6 (2005): 945-955), based on the requirement that the electrical field in the termination should be as uniform as possible.

For a given JTE width and depth, the breakdown voltage (VBR) is a strong function of the JTE doping level. At low doping levels, there are not enough active dopants in the JTE layer to reduce the peak bulk field below the edge of the metal contact. In this case, premature breakdown occurs near the active region. On the other hand, excessively high JTE doping prevents this region from full depletion so that it acts as an extension of the main junction. Breakdown then occurs near the termination periphery.

In general, a narrow peak occurs around the ideal JTE dose, implying that precise control over the dose is required to obtain VBR close to the ideal value. More particularly the higher the blocking voltage (i.e. voltage class), the narrower the peak and the higher the border dose, the faster the decrease of the VBR.

SUMMARY

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

The above-described issues conventionally have necessitated the design of complex termination designs (using floating rings and/or a combination of JTE and floating rings) and strict control over process parameters spread, with implications to cost, die size and manufacturability, especially for high-voltage devices.

Therefore, it is an aim of at least some embodiments of the present disclosure to improve the JTE for such semiconductor devices, in particular for high-voltage devices.

Accordingly, there is provided in a first aspect according to the present disclosure a semiconductor device. The semiconductor device comprises: an epitaxial layer doped with a first type of charge carrier [N]. The device further comprises at least one junction termination extension, JTE [=P doped ring], partially embedded in the epitaxial layer such that an upper surface of the at least one JTE is flush with an upper surface of the epitaxial layer, wherein the at least one JTE is doped with a second type of charge carrier [P] different from the first type of charge carrier and at a higher doping concentration than a doping concentration of the epitaxial layer. The device further comprises a passivation layer containing a sufficient quantity of the second type of charge carrier [P] and disposed on at least a part of an upper surface of the at least one JTE, such that the passivation layer is arranged to induce a surface charge density greater than 5E11 $cm^{-2}$ (i.e. $5\times10^{11}$ $cm^{-2}$, using the so-called E-notation for convenience from now on, where E represents "times ten raised to the power of") of the second type of charge carrier [P] on at least the part of the upper surface of the at least one JTE, by depleting an interior area of the at least one JTE of free charge carriers of the second type [P].

In an embodiment, the passivation layer is containing a sufficient quantity of the second type of charge carrier [P] so as to induce a surface charge density greater than 1E12 $cm^{-2}$, preferably greater than 5E12 $cm^{-2}$, of the second type of charge carrier [P] on at least the part of the upper surface of the at least one JTE.

In a preferred embodiment using Si, the induced surface charge density may be greater than 5E11 $cm^{-2}$. In another preferred embodiment using SiC, the induced surface charge density may be greater than 1E12 $cm^{-2}$.

In an embodiment, the at least one JTE is doped with the second type of charge carrier [P] at a doping concentration in a range of 1E17 to 1E18 $cm^{-3}$, preferably a range of 3E17 to 8E17 $cm^{-3}$.

In an embodiment, the passivation layer contacts only regions of the at least one JTE characterized by higher doping, preferably at a doping concentration greater than 5E17 $cm^{-3}$, than other regions of the at least one JTE. In other words, the at least one JTE comprises at least one region doped with the second type of charge carrier [P] at a doping concentration greater than 5E17 $cm^{-3}$, wherein the at least one region is covered by the passivation layer and wherein other regions of the at least one JTE than the at least one region are free from the passivation layer.

In an embodiment, the passivation layer is made of a nitride-based dielectric material, such as any one of the following materials: $SiON_x$; $SiN_x$ and/or $Si_3N_4$; or is made of a metallic oxide, such as any one of the following materials: $Al_2O_3$; AlN; and/or $TiO_2$. Other example materials may include any of the following materials: HfO2, ZrO2, HfSiO4, Ta2O5, Nb2O5, La2O3, BaO, MgO, CaO.

In an embodiment, the semiconductor device comprises an additional passivation layer disposed on the passivation layer, wherein the additional passivation layer is containing the second type of charge carrier [P] at a substantially lower quantity than the quantity of the passivation layer, such that the additional passivation layer is arranged to induce a surface charge density less than 1E11 $cm^{-2}$ of the second type of charge carrier [P] on the upper surface of the at least one JTE, and wherein a thickness of the additional passivation layer is substantially greater, preferably at least 2 times greater, more preferably at least 20 times greater, than a thickness of the passivation layer.

In an embodiment, the additional passivation layer contacts the at least one JTE.

In an embodiment, the semiconductor device comprises a plurality of floating guard rings partially embedded in the epitaxial layer such that upper surfaces of the plurality of floating guard rings are flush with an upper surface of the epitaxial layer, at a distance from the at least one JTE, wherein the plurality of floating guard rings is doped with the second type of charge carrier [P] at an equal or a higher doping concentration than a doping concentration of the at least one JTE; and wherein the additional passivation layer contacts the upper surfaces of the plurality of floating guard rings.

In an embodiment, the at least one JTE comprises a JTE well and a plurality of guard rings partially embedded in the JTE well such that upper surfaces of the plurality of guard rings are flush with an upper surface of the JTE well, and wherein the plurality of guard rings is doped with the second type of charge carrier [P] at a higher doping concentration than the doping concentration of the at least one JTE.

In an embodiment, the passivation layer extends at least over an entire upper surface of the at least one JTE.

In an embodiment, a lower surface of the passivation layer is aligned with the upper surface of the at least one JTE.

In an embodiment, the passivation layer extends over at most a part of an upper surface of the at least one JTE.

In an embodiment, the passivation layer has a thickness of at most 100 nm and has been deposited with atomic layer deposition.

Moreover, there is provided in a second aspect according to the present disclosure a method of producing a semiconductor device. The method comprises the following steps: Doping an epitaxial layer with a first type of charge carrier [N]. Partially embedding at least one junction termination extension, JTE [=P doped ring], in the epitaxial layer such that an upper surface of the at least one JTE is flush with an upper surface of the epitaxial layer, wherein the at least one JTE is doped with a second type of charge carrier [P] different from the first type of charge carrier and at a higher doping concentration than a doping concentration of the epitaxial layer. Disposing a passivation layer containing a sufficient quantity of the second type of charge carrier [P] on at least a part of an upper surface of the at least one JTE, such that the passivation layer is arranged to induce a surface charge density greater than 5E11 $cm^{-2}$ of the second type of charge carrier [P] on at least the part of the upper surface of the at least one JTE, by depleting an interior area of the at least one JTE of free charge carriers of the second type [P].

The skilled person will understand that the above-described considerations and advantages for embodiments of the semiconductor device according to the present disclosure may apply analogously to embodiments of the method according to the present disclosure, mutatis mutandis. In particular, any layers or elements described structurally with reference to embodiments of the semiconductor device may lead the skilled person to introduce one or more steps of depositing and/or etching in further developed embodiments of the method.

In an embodiment, the method comprises depositing the passivation layer with atomic layer deposition to a thickness of at most 100 nm.

In an embodiment, the passivation layer is containing a sufficient quantity of the second type of charge carrier [P] so as to induce a surface charge density greater than 1E12 $cm^{-2}$, preferably greater than 5E12 $cm^{-2}$, of the second type of charge carrier [P] on at least the part of the upper surface of the at least one JTE.

In an embodiment, the passivation layer is disposed such that the passivation layer contacts only regions of the at least one JTE characterized by higher doping, preferably at a doping concentration greater than 5E17 $cm^{-3}$, than other regions of the at least one JTE.

BRIEF DESCRIPTION OF THE DRAWINGS

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label.

DETAILED DESCRIPTION

Figure 1:
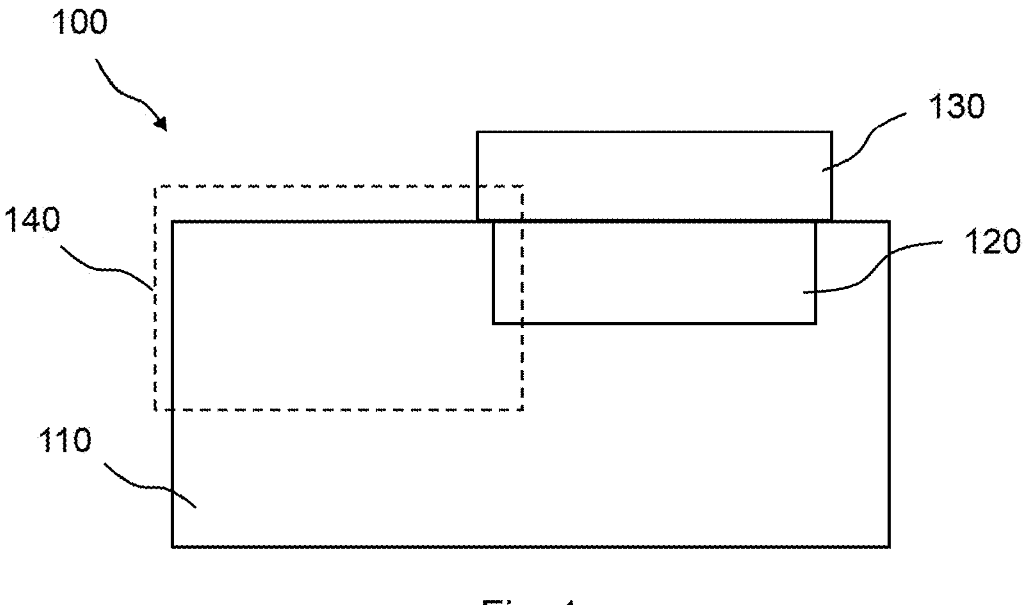
FIGS. 1, 2, 3, 4, 5, 6, 7, 8, 9 and 10 schematically illustrate various exemplary embodiments of a semiconductor device according to the present disclosure.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

The techniques introduced herein can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions. The machine-readable medium includes non-transitory medium, where non-transitory excludes propagation signals. For example, a processor can be connected to a non-transitory computer-readable medium that stores instructions for executing instructions by the processor.

Power devices are required to have excellent voltage blocking capabilities, high current ratings, high reliability, and good thermal characteristics. For example, silicon carbide (SiC) devices exhibit high performance for industrial and automotive power applications, as they are characterized by a high heat resistance, excellent thermal properties and effective performance at high switching frequencies and power levels. In high-voltage devices, avoiding premature breakdown is a key element.

Due to three-dimensional junction curvature effects and electric field crowding near the edge of the junction, unterminated planar devices exhibit very low breakdown voltages as compared to ideal one-dimensional device structures. Therefore, junction termination methods are important to attain high breakdown voltages.

It has in particular been observed how the use of high border dose/doping increases the avalanche ruggedness (i.e. UIS capability) of power diode's technology, especially SiC based. For high border doses, there is a higher probability of avalanche breakdown in active area, more than in the termination. As the avalanche current is distributed in the larger active area region, the detrimental effects due to avalanche breakdown are somewhat minimized, as the power is dissipated over a larger area. High avalanche ruggedness (i.e. UIS capability) refers mostly to this behaviour. However, using high border dose in the JTE makes the termination unstable, as the depletion of the JTE can only be partial. This is due to the PN junction at the termination being fully depleted at the blocking voltage. However, the depletion of the JTE can be only partial due to its higher doping compared to the epitaxial layer. This is especially true when high doping is used in the termination, intentionally or due to some process drifts.

Thus, the breakdown stability in the high JTE dose/doping range is extremely critical, especially on high voltage devices (see e.g. Mahajan, Atul, and B. J. Skromme. "Design and optimization of junction termination extension (JTE) for 4H-SiC high-voltage Schottky diodes." *Solid-State Electronics* 49.6 (2005): 945-955, showing how the maximum VBR decreases faster for greater doses than the peak).

Unfortunately, surface charges, or more generally, charges in the passivating dielectric film surrounding the metal contact are unavoidable, due to the nature of the dielectric films and deposition technique. In general, since the JTE structure requires precise control of the implanted charge, any additional charge due to dielectric, interface, or surface charges will alter the potential distribution in the JTE, leading to undesirable behaviour.

As explained above, it is an aim of at least some embodiment of the present disclosure to improve the JTE for such semiconductor devices, in particular for high-voltage devices.

Accordingly, there are provided embodiments of a semiconductor device according to the present disclosure, as described above, and as illustrated in further detail below.

In an embodiment of the semiconductor device of the present disclosure, it is advantageous to use the interface charges induced by a passivation layer to partly compensate the high JTE doping only at the surface of the JTE layer while the high JTE doping in the bulk would continue to determine improved UIS (Unclamped Inductive Switching) performance, because using high border doses in the JTE would continue to guarantee an earlier breakdown in active area. There are in general two breakdown levels, one determined by the PN junction in the active area, another by the PN junction in the termination. To guarantee high UIS, the device should break before in active area. Using high border dose helps to achieve this purpose. However, the termination becomes unstable because the JTE is not fully depleted for its high doping, as was described above.

In other words, the passivation layer (or layers) may provide a compensation of the JTE doping only at the top of the JTE layer (i.e. at the interface with the passivation layer), without interfering with the JTE doping in the bulk, improving the stability of the termination on one end and allowing to reach improved higher UIS on the other hand. This makes control of the termination doping in the high range less critical, which allows the use of simple termination concepts (e.g. JTE) for high-voltage devices.

It is currently believed that this is due to the lower surface doping of the JTE (produced by the doping compensation effect induced by the passivation) which extends the depleted region extension in the JTE also at the surface of this layer improving in this way the VBR stability, as this region would not deplete otherwise, due to its higher doping. In other words, surface charge provided by the passivation layer contributes to deplete the P doped layer on the upper side, helping the termination to work more efficiently thanks to the wider space charge region and pinch-off between upper and lower depleted regions occurring at a lower bias.

This effect is not or not significantly provided by low surface charge dielectric layers (e.g. TEOS/Thermal Oxide/Silane Oxide), producing early failures.

The passivation layer can be deposited by using standard deposition techniques (CVD, PECVD) easily accessible in every clean room facility. The method to create the passivation layer able to induce the desired surface charge density in the semiconductor region is up to the choice of the skilled person implementing the process. However, a clear and precise control of the surface charge is not strictly needed, as long as the disclosed minimum surface charge density is reached.

Of course, in some practical embodiments, the semiconductor device may comprise a substrate arranged to support the epitaxial layer (directly, such that the epitaxial layer rests on the substrate, or indirectly, such that one or more other layers separate the epitaxial layer from the substrate). For reasons of brevity, these and similar details which the skilled person may see fit to include are not described in detail in the following description of the various exemplary embodiments.

It is noted that the above-described UIS improvement is applicable to power diodes, such as Schottky Diodes, PN Diodes, Junction Barrier Schottky (JBS) Diodes, and/or Merged PIN Schottky (MPS) diodes. The inventors currently see no reason to exclude applicability to other power technologies that have termination regions, such as e.g. MOSFETs.

FIGS. 1-10 schematically illustrate various exemplary embodiments 100, 200, 300, 400, 500, 600, 700, 800, 900, 1000 of a semiconductor device according to the present disclosure.

FIG. 1 shows (a part of) a semiconductor device 100. The semiconductor device 100 comprises: an epitaxial layer 110 doped with a first type of charge carrier [N]. The device further comprises at least one junction termination extension or JTE 120 [=P doped ring], which is partially embedded in the epitaxial layer 110 such that an upper surface of the at least one JTE 120 is flush with an upper surface of the epitaxial layer 110. The at least one JTE 120 is doped with a second type of charge carrier [P] different from the first type of charge carrier and at a higher doping concentration than a doping concentration of the epitaxial layer 110. In some practical embodiments, the at least one JTE 120 may surround an area 140 of the epitaxial layer 110, which area 140 can be designated as an "active area" 140 of the semiconductor device 100 when the semiconductor device 100 is in operation. The skilled person will appreciate that the part of the semiconductor device 100 shown in this figure is a detail, and that the at least one JTE 120 may have an extended shape so as to surround the active area 140. For example, the extended shape of the at least one JTE 120 may be square, hexagonal, octagonal, etc.

The semiconductor device 100 further comprises a passivation layer 130 containing a sufficient quantity of the second type of charge carrier [P] and disposed on at least a part of an upper surface of the at least one JTE 130, such that the passivation layer 130 is arranged to induce a surface charge density greater than 5E11 $cm^{-2}$ (i.e. $5\times10^{11}$ $cm^{-2}$, using the so-called E-notation for convenience from now on, where E represents "times ten raised to the power of") of the second type of charge carrier [P] on at least the part of the upper surface of the at least one JTE 120, by depleting an interior area of the at least one JTE 120 of free charge carriers of the second type [P].

In FIG. 1, the passivation layer 130 extends at least over the entire upper surface of the at least one JTE 120. In particular, it may extend even further to the sides than that.

Figure 2:
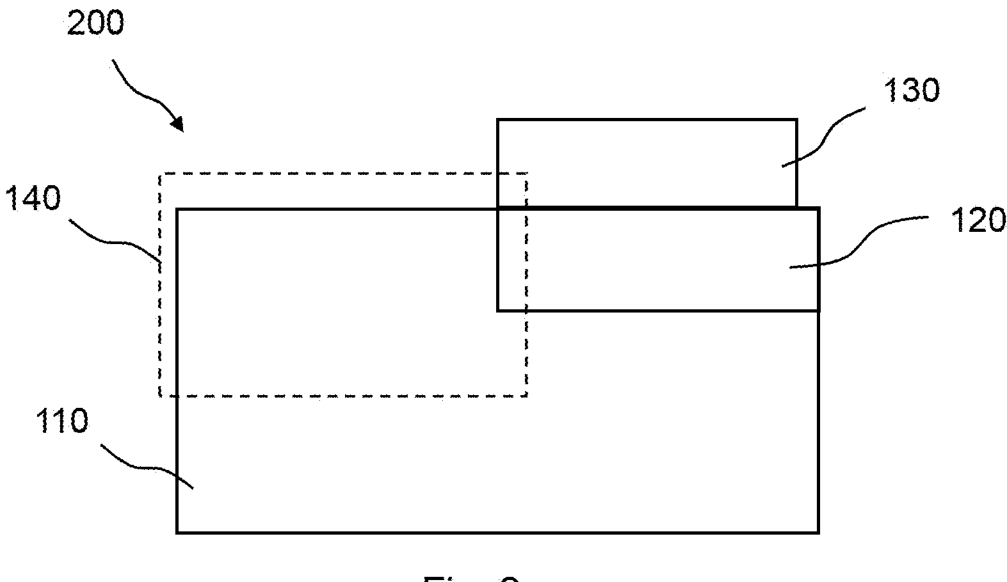

FIG. 2 is similar to FIG. 1, except in that the passivation layer 130 extends over at most a part of the upper surface of the at least one JTE 120. For example, it may leave uncovered one side or the opposite side, or both sides of the at least one JTE 120.

Figure 3:
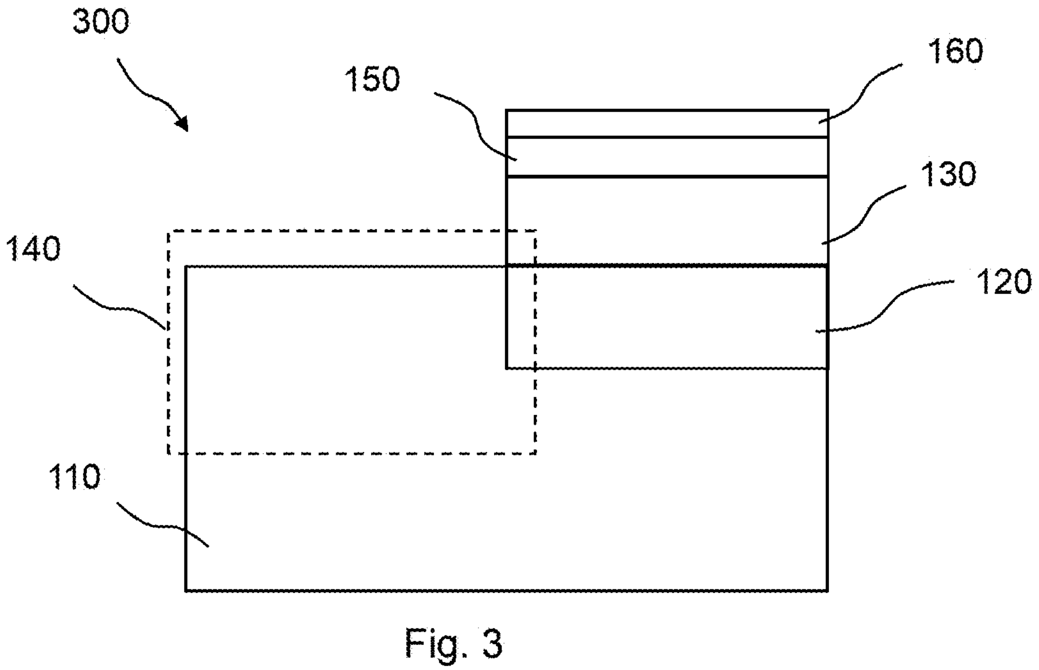

FIG. 3 is similar to FIGS. 1 and 2, except in that an additional passivation layer 150, 160 is disposed on the passivation layer 130. The additional passivation layer 150, 160 contains the second type of charge carrier [P] at a substantially lower quantity than the quantity of the passivation layer 130, such that the additional passivation layer 150, 160 is arranged to induce a surface charge density less than 1E11 $cm^{-2}$ of the second type of charge carrier [P] on the upper surface of the at least one JTE 120.

In this example, the additional passivation layer 150, 160 comprises two layers, so a first additional layer 150 and a second additional layer 160. However, it will be understood that the additional passivation layer may instead comprise only one additional layer, or may instead comprise more than two additional layers.

Figure 4:
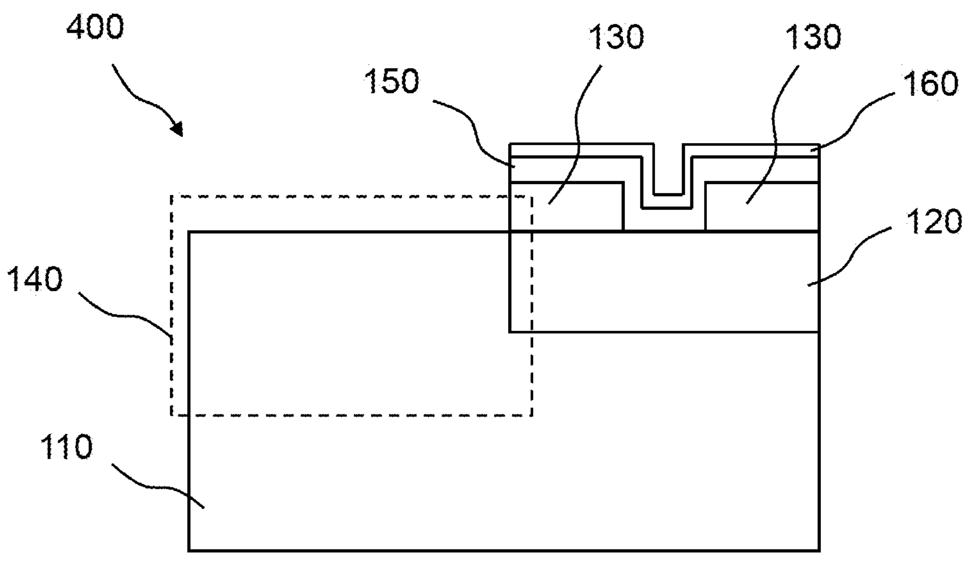

FIG. 4 is similar to FIG. 3, except in that the passivation layer 130 comprises multiple disjoint parts and thus does not extend over the entire upper surface of the at least one JTE 120, thus leaving some areas of the JTE 120 uncovered.

It is advantageous that the first passivation layer 130 may contact only the regions with the highest doping in the at least one JTE 120, while the additional passivation layer 150, 160 not inducing significant charges may contact only the parts of the at least one JTE 120 with lower doping, i.e. the parts of the at least one JTE 120 in between the multiple disjoint parts of the passivation layer 130.

In practice, the passivation layer 130 may be 1 um wide, and the remaining width of JTE 120 may be covered by an additional passivation layer 150, 160, thus providing compensation in the central part of higher doping, so only where necessary.

Figure 5:
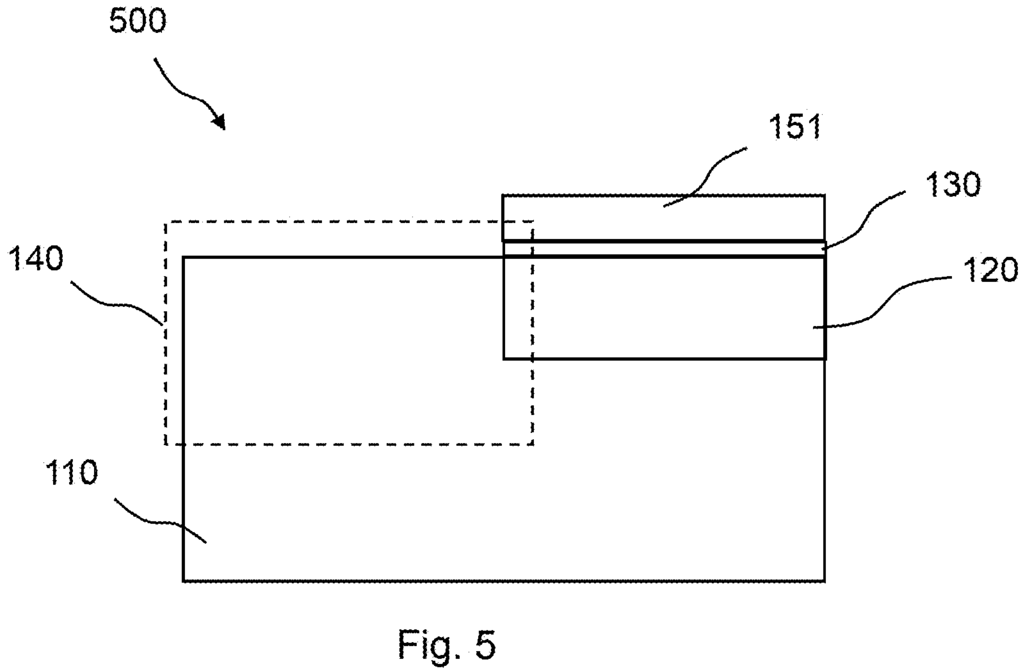

FIG. 5 is similar to FIG. 3, except in that a thickness of the additional passivation layer 151 is substantially greater, preferably at least 2 times greater, more preferably at least 20 times greater, than a thickness of the passivation layer 130. This may help to minimize the impact of parasitic effects such as mobile charges, thus improving stability. In a preferred embodiment, passivation layer 130 and additional passivation layer 151 may be composed of the same dielectric material or different materials and are characterized by:

Different amounts of mobile charges (substantially lower in additional layer 151)

Different thickness (much lower for passivation layer 130, e.g. only 5%)

Figure 6:
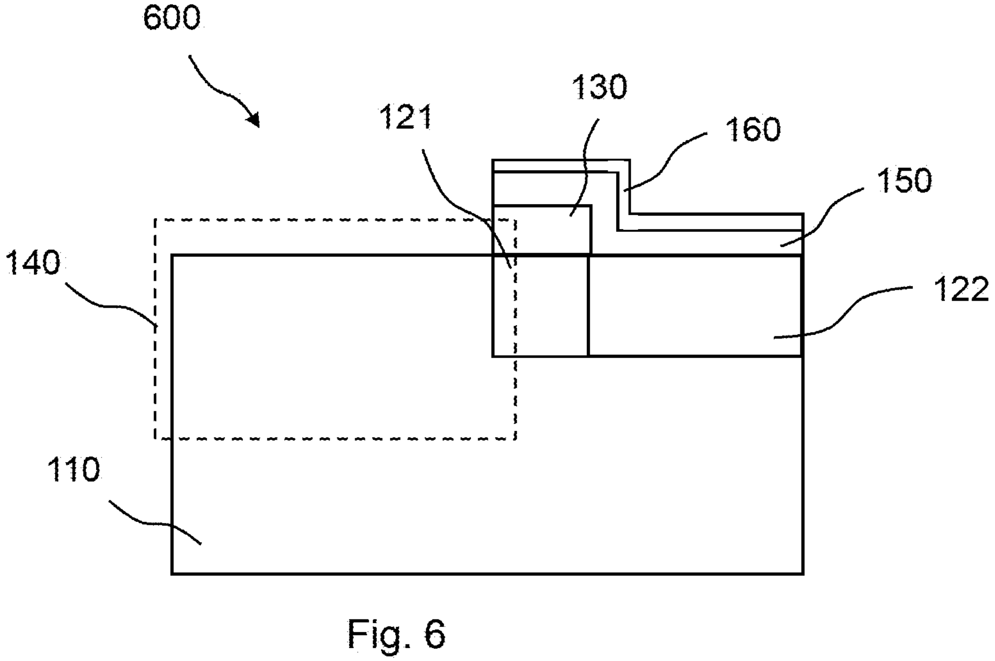

FIG. 6 is similar to FIG. 4, except in that the at least one JTE 120 now comprises a high-doped region 121 and a low-doped region 122. In a preferred embodiment, these would respectively be designated as P+doped and P-doped.

The figure also shows that the additional passivation layer 150, 160 contacts the at least one JTE 121, 122, thus leaving some areas of the at least one JTE, like low-doped area 122, uncovered by the passivation layer 130. In other words, the passivation layer 130 may advantageously be disposed only on regions of the at least one JTE that are characterized by higher doping than other regions of the at least one JTE, e.g. at a doping concentration greater than 5E17 $cm^{-3}$, such as high-doped area 121. Of course, in further developed embodiment, such as the embodiment 600 illustrated FIG. 6, the additional passivation layer 150, 160 may contact the areas of the at least one JTE, like area 122, which are low-doped.

This may advantageously help to partly compensate the high doping of the region 121 in case of undesired process drifts.

Figure 7:
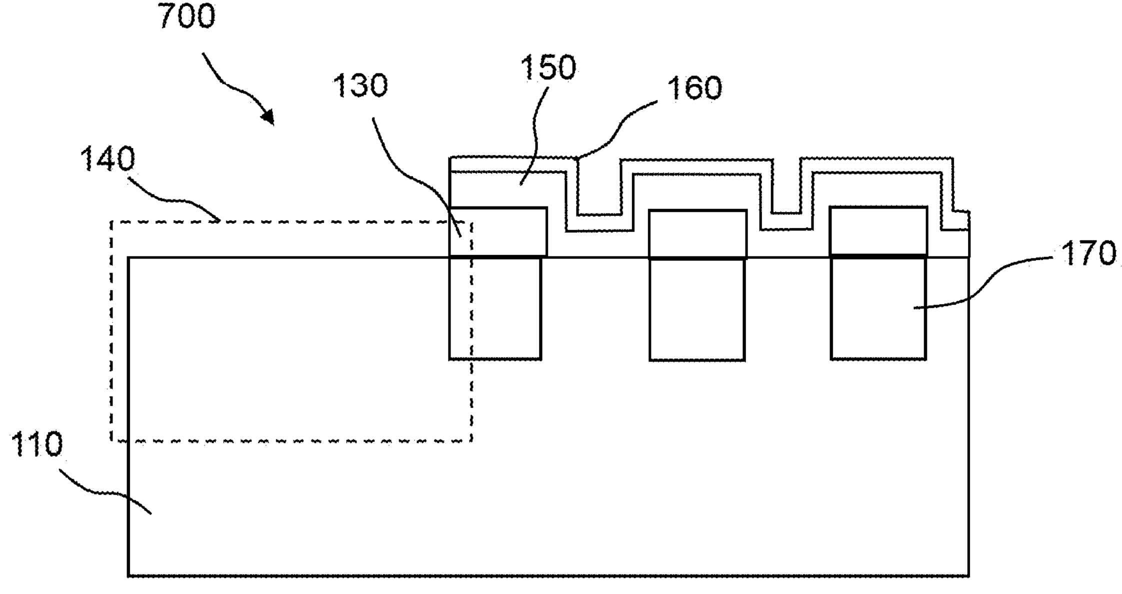

FIG. 7 is similar to FIG. 6, except in that the at least one JTE is not formed as a single element, but rather comprises multiple guard rings 170. Referring to the explanation given above for FIG. 6, the guard rings 170, which together form the at least one JTE, may be covered by the passivation layer 130, leaving the areas of the epitaxial layer 110 remaining in-between the guard rings 170 to be contacted only by the additional passivation layer 150, 160.

Figure 8:
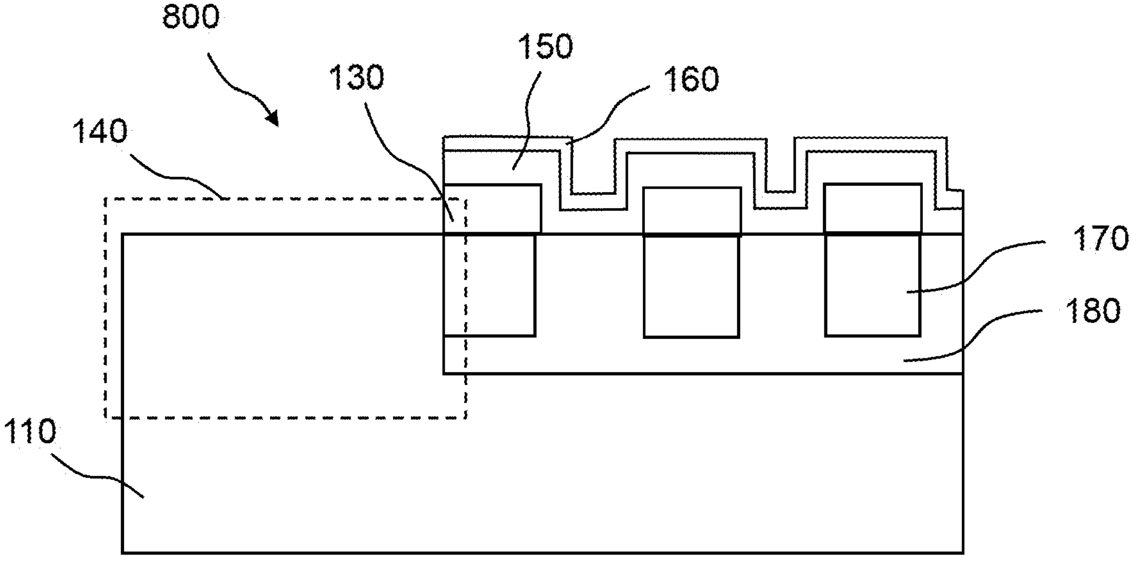

FIG. 8 is similar to FIG. 7, except in that multiple high-doped guard rings 170 are embedded in a low-doped JTE well 180. The doping level of the guard rings 170 may be higher if they are embedded in such a JTE well 180.

Figure 9:
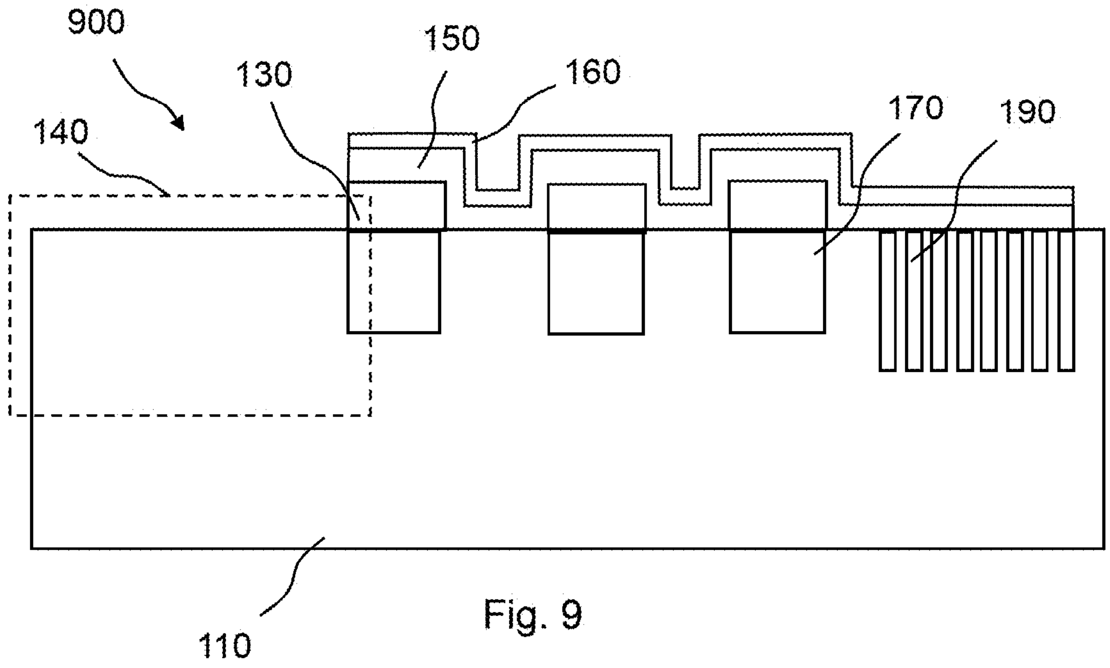

FIG. 9 is similar to FIG. 7, except in that multiple floating guard rings 190 are provided besides the at least one JTE 170, at a side opposite from the active area 140. Floating guard rings 190 comprise strips of low doping (at the same doping concentration as the JTE 170) with fixed width and spacing.

Figure 10:
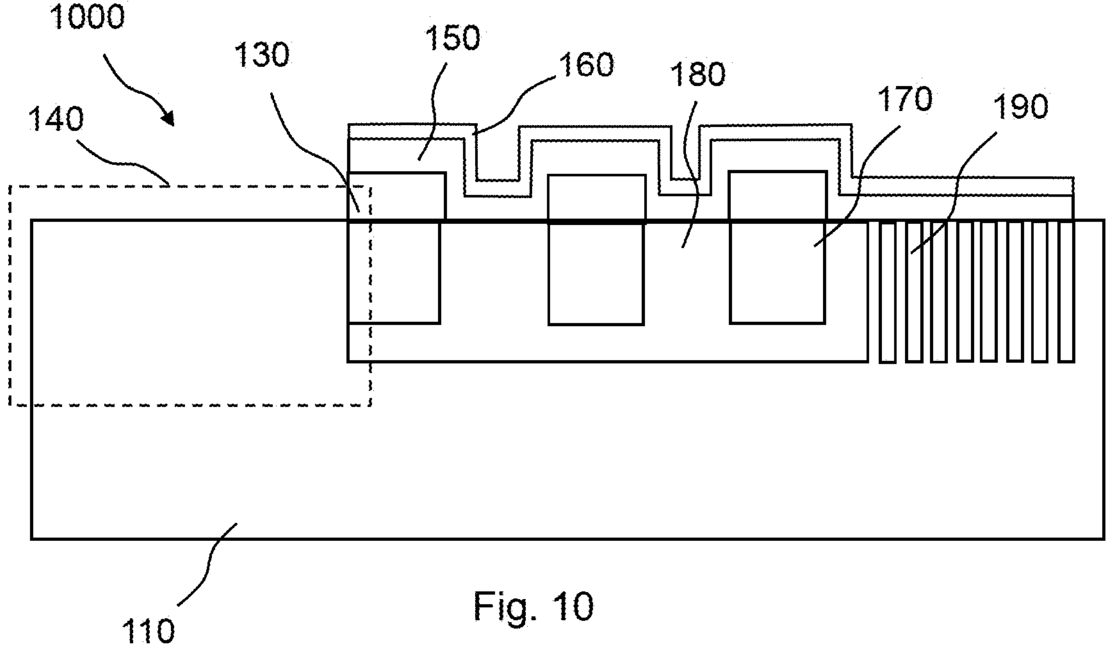

FIG. 10 is similar to FIG. 8 in the same way that FIG. 9 is similar to FIG. 7.

Figure 11:
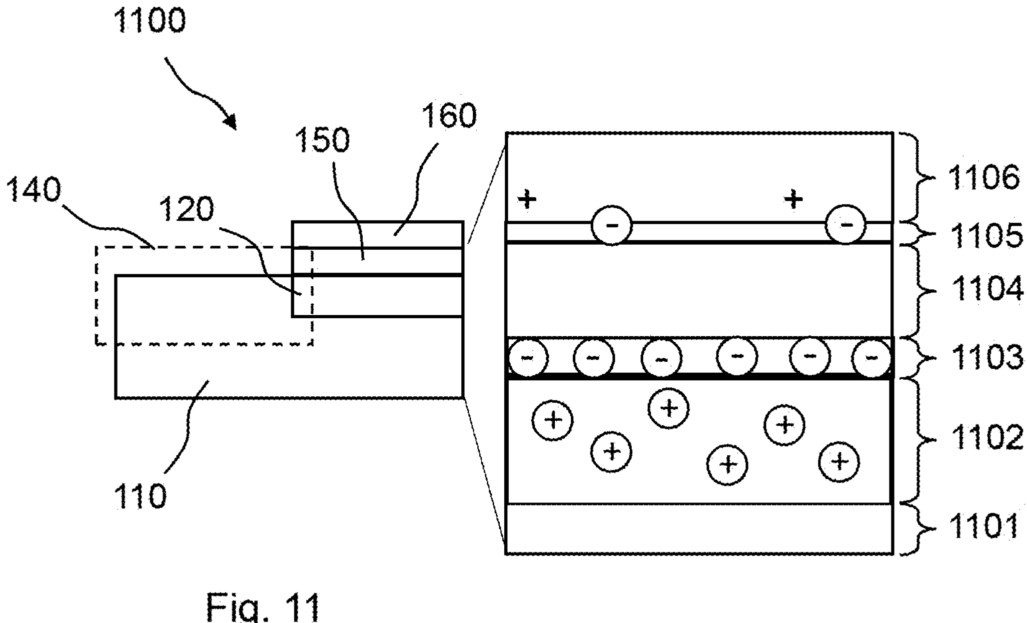
FIGS. 11 and 12 schematically illustrate a distribution of charge carriers for a comparative example and a working example of an exemplary embodiment of a semiconductor device according to the present disclosure, respectively.
Figure 12:
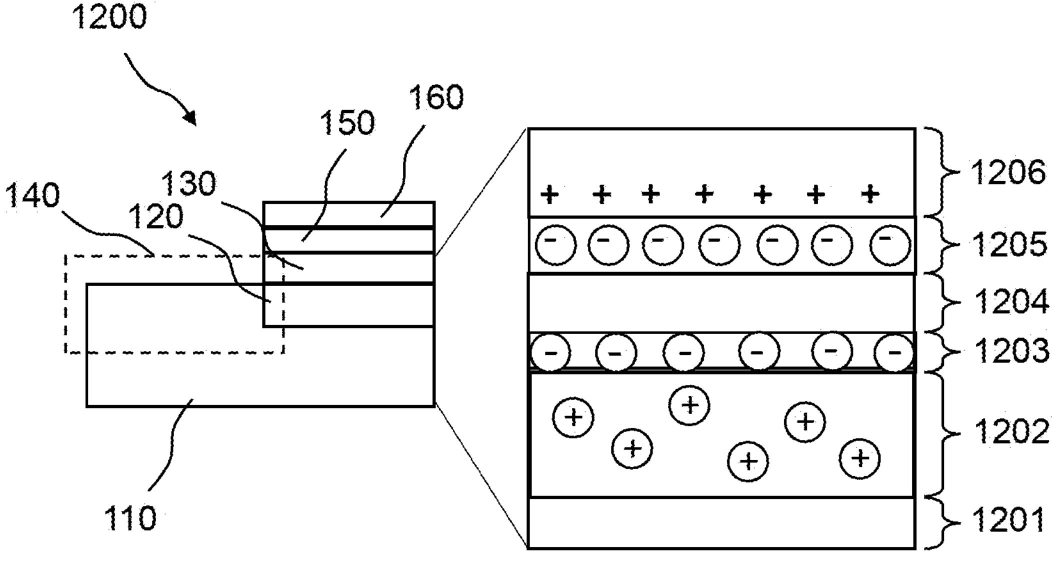

FIGS. 11 and 12 schematically illustrate a distribution of charge carriers for a comparative example 1100 and a working example 1200 of an exemplary embodiment of a semiconductor device according to the present disclosure, respectively.

Note that in the comparative example 1100 of a semiconductor device there is no passivation layer 130 present, whereas in the working example 1200 of a semiconductor device embodiment according to the present disclosure there is a passivation layer 130 present.

The effect of this difference is illustrated schematically in the expanded layers shown to the right of each device. It can clearly be seen that the undepleted region 1104 of the JTE of comparative example 1100 has a relatively larger width (i.e. in the dimension in the vertical direction in this figure) than the undepleted region 1204 of the JTE of working example 1200. Thus, the width of the undepleted region 1204 of the JTE of working example 1200 is decreased. The depleted regions 1103, 1105 and 1203, 1205 are pinching off and thus determine the width of the undepleted regions 1104 and 1204 in-between them, respectively. In practice, region 1205 is a further depleted region at the interface with the passivation layer which depletes the P type layer from the top, pinching at the end the further depleted region 1203 formed below at the junction with the epitaxial layer. The higher quantity of charge contained in layer 1206 (which can of course be expressed as a quantity of charge contained per unit of volume) compared to layer 1106 allows to increase the width of the depleted region 1205 compared to region 1105, due to the JTE doping partial compensation in the upper surface at the interface with the passivation layer. Note that there is no significant change to the lower surface of the JTE 1103, 1203, nor to the epitaxial layer 1101, 1102, 1201, 1202 between these two examples.

Figure 13:
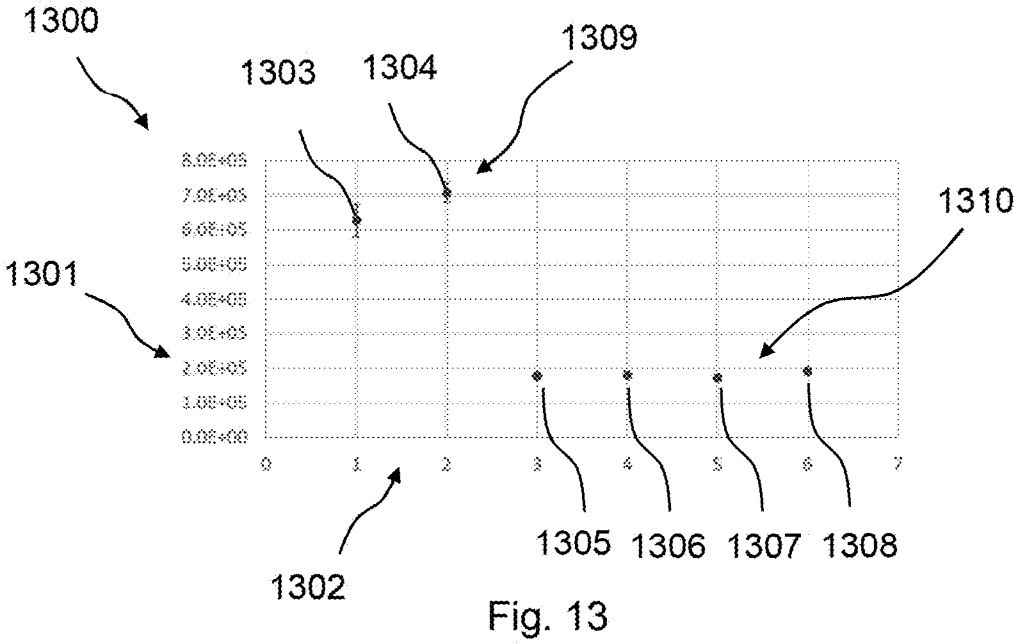
FIG. 13 shows a plot of border sheet resistance of multiple wafers containing various comparative examples and various working examples of an exemplary embodiment of a semiconductor device according to the present disclosure.

FIG. 13 shows a plot of border sheet resistance of multiple wafers containing various comparative examples and various working examples of an exemplary embodiment of a semiconductor device according to the present disclosure. The border in this context refers to the P doped layer sheet resistance in the JTE.

The figure shows a graph 1300 of border sheet resistance 1301 for different wafer numbers 1302. The graph 1300 depicts 6 different wafers 1303-1308. The wafers 1303 and 1304 (together designated as 1309) correspond with the working example 1200 of FIG. 12, thus with a semiconductor device comprising a passivation layer 130 as described above. In contrast, the wafers 1305, 1306, 1307, 1308 (together designated as 1310) correspond with the comparative example 1100, thus with a semiconductor device lacking a passivation layer 130 as described above. The graph 1300 indicates that the resistance is much greater for wafers 1309, which shows the effect of the passivation layer 130.

Figure 14:
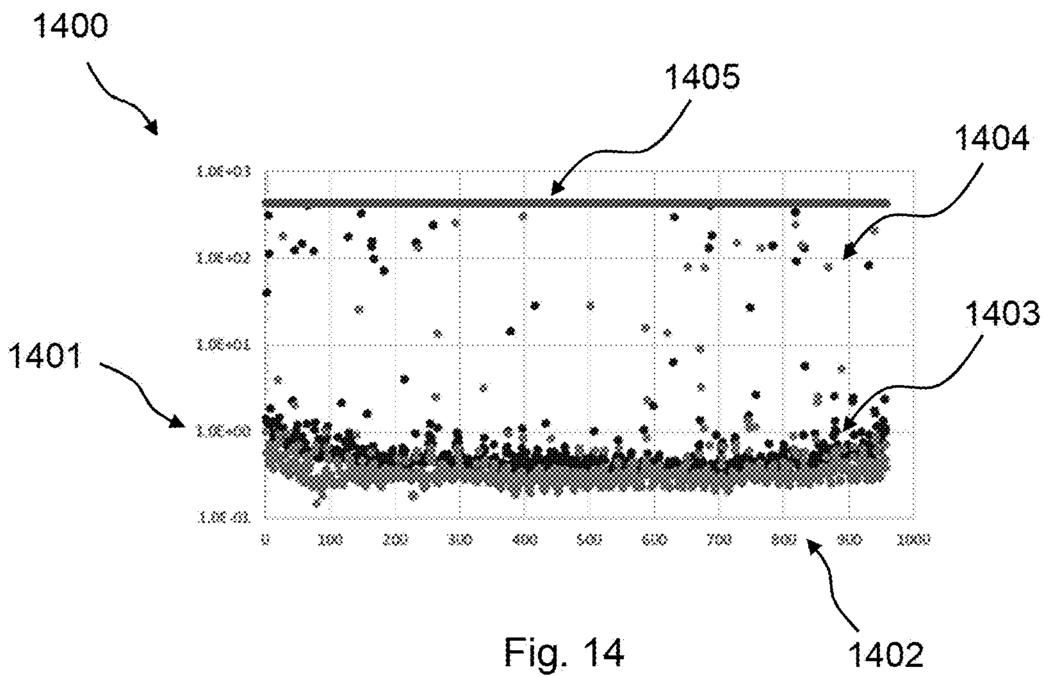
FIG. 14 shows a plot of leakage current for the wafers of FIG. 13, thus contrasting various comparative examples with various working examples of an exemplary embodiment of a semiconductor device according to the present disclosure.

FIG. 14 shows a plot of leakage current for the wafers of FIG. 13, thus contrasting various comparative examples with various working examples of an exemplary embodiment of a semiconductor device according to the present disclosure.

The figure shows a graph 1400 of leakage current 1401 for different devices 1402. While there are hundreds of devices shown, it will suffice here to point out three general distributions of devices. The devices 1403 and 1404 represent again devices that correspond with the working example 1200 of FIG. 12, thus with a semiconductor device comprising a passivation layer 130 as described above. Again, in contrast, the devices 1405 correspond with the comparative example 1100, thus with a semiconductor device lacking a passivation layer 130 as described above.

It can be seen that the devices 1405 lacking the passivation layer 130 suffer from a much greater leakage current than the devices 1403 and most of the devices 1404, but that of course due to practical defects in the production process, some of the devices 1404 also have a higher leakage current. It is moreover noted that for the devices 1405 with such a high leakage current, the indicated leakage current value is actually a constant compliance current value, which is due to measurements limitations. The measured leakage current would be much higher without compliance.

Various embodiments according to the present disclosure may find application for SiC MOSFET and diodes, and in general for every Si or Wide Band Gap (e.g. SiC, GaN)

power device making use of a termination region, in particular high-voltage devices (>1.2 kV).

LIST OF REFERENCE NUMBERS

100, 200, 300, 400, 500, 600, 700, 800, 900, 1000: embodiments of a semiconductor device according to the present disclosure
110: epitaxial layer
120: JTE
130: passivation layer
140: active area
150: additional passivation layer (first additional layer)
160: additional passivation layer (second additional layer)
151: additional passivation layer
121: high-doped region of JTE
122: low-doped region of JTE
170: high-doped guard ring of JTE
180: low-doped JTE well
190: floating guard rings
1100: comparative example of a semiconductor device
1200: working example of a semiconductor device embodiment according to the present disclosure
1101, 1102, 1103, 1104, 1105, 1106: layers
1201, 1202, 1203, 1204, 1205, 1206: layers
1300: graph
1301: border sheet resistance
1302: wafer number
1303, 1304: wafers
1305, 1306, 1307, 1308: wafers
1309: wafer group
1310: wafer group
1400: graph
1401: leakage current
1402: device number
1403: devices
1404: devices
1405: devices

The invention claimed is:

1. A semiconductor device comprising:
an epitaxial layer doped with dopants of a first conductivity type;
at least one junction termination extension (JTE), the JTE being a P doped ring, partially embedded in the epitaxial layer so that an upper surface of the at least one JTE is flush with an upper surface of the epitaxial layer, wherein the at least one JTE is doped with dopants of a second conductivity type different from the first conductivity type and at a higher doping concentration than a doping concentration of the epitaxial layer; and
a passivation layer having a sufficient quantity of the charge carriers of the second conductivity type and disposed on at least a part of an upper surface of the at least one JTE, so that the passivation layer is arranged to induce a surface charge density greater than 5E11 $cm^{-2}$ of the first conductivity type on at least the part of the upper surface of the at least one JTE, by depleting an interior area of the at least one JTE of free charge carriers of the second conductivity type,
wherein the at least one JTE is doped with the second type of charge carrier at a doping concentration in a range of 1E17 to 1E18 $cm^{-3}$, and
wherein the passivation layer contacts only regions of the at least one JTE having higher doping, than other regions of the at least one JTE.

2. The semiconductor device of claim 1, wherein the passivation layer contains a sufficient quantity of the second type of charge carrier so as to induce a surface charge density greater than 1E12 $cm^{-2}$ of the first conductivity type on at least the part of the upper surface of the at least one JTE.

3. The semiconductor device of claim 1, wherein the passivation layer is made of a nitride-based dielectric material selected from the group consisting of: $SiON_x$, $SiN_x$, and $Si_3N_4$; or is made of a metallic oxide selected from the group consisting of: $Al_2O_3$, AlN, and $TiO_2$.

4. The semiconductor device of claim 1, further comprising an additional passivation layer disposed on the passivation layer, wherein the additional passivation layer has the second type of charge carrier at a substantially lower quantity than the quantity of the passivation layer, so that the additional passivation layer is arranged to induce a surface charge density less than 1E11 $cm^{-2}$ of the first conductivity type of charge carrier on the upper surface of the at least one JTE.

5. The semiconductor device of claim 4, wherein the additional passivation layer has a thickness that is at least 2 times greater than a thickness of the passivation layer.

6. The semiconductor device of claim 4, wherein the additional passivation layer contacts the at least one JTE.

7. The semiconductor device of claim 4, further comprising a plurality of floating guard rings partially embedded in the epitaxial layer so that upper surfaces of the plurality of floating guard rings are flush with an upper surface of the epitaxial layer at a distance from the at least one JTE, wherein the plurality of floating guard rings is doped with the second type of charge carrier at an equal or a higher doping concentration than a doping concentration of the at least one JTE, and wherein the additional passivation layer contacts the upper surfaces of the plurality of floating guard rings.

8. The semiconductor device of claim 5, wherein the additional passivation layer contacts the at least one JTE.

9. The semiconductor device of claim 5, further comprising a plurality of floating guard rings partially embedded in the epitaxial layer so that upper surfaces of the plurality of floating guard rings are flush with an upper surface of the epitaxial layer at a distance from the at least one JTE, wherein the plurality of floating guard rings is doped with the second type of charge carrier at an equal or a higher doping concentration than a doping concentration of the at least one JTE, and wherein the additional passivation layer contacts the upper surfaces of the plurality of floating guard rings.

10. The semiconductor device of claim 6, further comprising a plurality of floating guard rings partially embedded in the epitaxial layer so that upper surfaces of the plurality of floating guard rings are flush with an upper surface of the epitaxial layer at a distance from the at least one JTE, wherein the plurality of floating guard rings is doped with the second type of charge carrier at an equal or a higher doping concentration than a doping concentration of the at least one JTE, and wherein the additional passivation layer contacts the upper surfaces of the plurality of floating guard rings.

11. The semiconductor device of claim 1, wherein the at least one JTE comprises a JTE well and a plurality of guard rings partially embedded in the JTE well so that upper surfaces of the plurality of guard rings are flush with an upper surface of the JTE well, and wherein the plurality of guard rings is doped with the second type of charge carrier at a higher doping concentration than the doping concentration of the at least one JTE.

12. The semiconductor device of claim 1, wherein the passivation layer extends at least over an entire upper surface of the at least one JTE.

13. The semiconductor device of claim 12, wherein the passivation layer has a lower surface that is aligned with the upper surface of the at least one JTE.

14. The semiconductor device of claim 1, wherein the passivation layer extends over at most a part of an upper surface of the at least one JTE.

15. The semiconductor device of claim 1, wherein the passivation layer has a thickness of at most 100 nm and has been deposited with atomic layer deposition.

16. A method of manufacturing a semiconductor device, the method comprising the steps of:

doping an epitaxial layer with dopants of a first conductivity type;

partially embedding at least one junction termination extension (JTE), the JTE being a P doped ring in the epitaxial layer so that an upper surface of the at least one JTE is flush with an upper surface of the epitaxial layer, wherein the at least one JTE is doped with dopants of a second conductivity type different from the first conductivity type and at a higher doping concentration than a doping concentration of the epitaxial layer; and disposing a passivation layer containing a sufficient quantity of charge carriers of the second conductivity type on at least a part of an upper surface of the at least one JTE, so that the passivation layer is arranged to induce a surface charge density greater than 5E11 $cm^{-2}$ of the first conductivity type on at least the part of the upper surface of the at least one JTE, by depleting an interior area of the at least one JTE of free charge carriers of the second conductivity type, wherein the at least one JTE is doped with the second type of charge carrier at a doping concentration in a range of 1E17 to 1E18 $cm^{-3}$, and wherein the passivation layer is disposed so that the passivation layer contacts only regions of the at least one JTE having higher doping than other regions of the at least one JTE.

17. The method of claim 16, further comprising the step of depositing the passivation layer with atomic layer deposition to a thickness of at most 100 nm.

18. The method of claim 16, wherein the passivation layer contains a sufficient quantity of the second type of charge carrier so as to induce a surface charge density greater than 1E12 $cm^{-2}$ of the first conductivity type on at least the part of the upper surface of the at least one JTE.

* * * * *